(12) United States Patent
Mueller et al.

(10) Patent No.: US 8,735,218 B2
(45) Date of Patent: May 27, 2014

(54) METHOD AND APPARATUS FOR MANUFACTURING AN ELECTRONIC ASSEMBLY, ELECTRONIC ASSEMBLY MANUFACTURED WITH THE METHOD OR IN THE APPARATUS

(75) Inventors: Michael Max Mueller, Hartenstein (DE); Helfried Zabel, Dresden (DE); Hans-Peter Monser, Dresden (DE)

(73) Assignee: Muehlbauer AG, Roding (DE)

( * ) Notice: Subject to any disclaimer, the term of this patent is extended or adjusted under 35 U.S.C. 154(b) by 210 days.

(21) Appl. No.: 13/139,478

(22) PCT Filed: Dec. 1, 2009

(86) PCT No.: PCT/EP2009/008558
§ 371 (c)(1),
(2), (4) Date: Aug. 22, 2011

(87) PCT Pub. No.: WO2010/066366
PCT Pub. Date: Jun. 17, 2010

(65) Prior Publication Data
US 2011/0291302 A1    Dec. 1, 2011

Related U.S. Application Data

(60) Provisional application No. 61/176,521, filed on May 8, 2009.

(30) Foreign Application Priority Data

Dec. 13, 2008  (DE) .......................... 10 2008 062 211
May 8, 2009  (DE) .......................... 10 2009 020 540

(51) Int. Cl.
H01L 21/00 (2006.01)
B23P 19/00 (2006.01)
H01L 23/48 (2006.01)
B29C 65/00 (2006.01)

(52) U.S. Cl.
USPC ............... 438/107; 438/6; 438/106; 438/118; 438/464; 29/739; 29/740; 29/760; 29/822; 257/773; 257/782; 257/783; 257/E23.16; 257/E23.514; 257/E21.584; 156/60; 156/556

(58) Field of Classification Search
USPC ........... 438/107, 6, 28, 66, 67, 106, 406, 339, 438/455–459, 584, 758, 438/FOR. 211–FOR. 220, FOR. 365, 438/FOR. 366, FOR. 367, FOR. 368, 628, 438/644, 654; 257/723, 685, 726, E25.031, 257/E25.032, E23.01, E21.499; 29/739–744

See application file for complete search history.

(56) References Cited

U.S. PATENT DOCUMENTS 5,075,965 A   12/1991  Carey
7,141,451 B2  11/2006  Tsunoda
(Continued)

FOREIGN PATENT DOCUMENTS

DE   19 837 946 A1   2/2000
DE   19 962 194 A1   6/2001
(Continued)

OTHER PUBLICATIONS

Becker K. F. "Contactless Device Handling—New Assembly Approaches for the Micro-Nano-Intergration" Conference on Smart System Integration Apr. 8-9, 2008, Barcelona, pp. 1-37.

(Continued)

*Primary Examiner* — Jasmine Clark
(74) *Attorney, Agent, or Firm* — John A. Miller; Miller IP Group, PLC

(57) ABSTRACT

A method of producing an electronic module with at least one electronic component and one carrier. A structure is provided on the carrier so that the electronic component can take a desired target position relative to the structure. The structure is coated with a liquid meniscus suitable for receiving the electronic component. Multiple electronic components are provided at a delivery point for the electronic components. The carrier, with the structure, is moved nearby and opposite to the delivery point, where the delivery point delivers one of the electronic components without contact, while the structure on the carrier is moving near the delivery point, so that after a phase of free movement the electronic component at least partly touches the material, and the carrier, with the structure, is moved to a downstream processing point, while the electronic component aligns itself to the structure on the liquid meniscus.

30 Claims, 10 Drawing Sheets

(56) References Cited

U.S. PATENT DOCUMENTS

| | | | |
|---|---|---|---|
| 7,195,714 | B2 | 3/2007 | Bock |
| 7,554,198 | B2 * | 6/2009 | Ogata et al. ............ 257/737 |
| 2002/0195194 | A1 | 12/2002 | Grabau |
| 2006/0105549 | A1 | 5/2006 | Duineveld |
| 2006/0226013 | A1 | 10/2006 | Decre |
| 2007/0181252 | A1 | 8/2007 | Bohm |
| 2008/0179726 | A1 * | 7/2008 | Sung et al. ............ 257/685 |
| 2009/0023243 | A1 | 1/2009 | Koyanagi |

FOREIGN PATENT DOCUMENTS

| | | |
|---|---|---|
| DE | 10 140 661 C1 | 1/2003 |
| DE | 10 151 657 C1 | 2/2003 |
| EP | 1 143 378 A1 | 10/2001 |
| JP | 2005-115916 A | 4/2005 |
| WO | WO 2006-017401 A2 | 2/2006 |

OTHER PUBLICATIONS

Usami Mitsuo, "An Ultra-Small RFID Chip: u-chip" 2004 IEEE Asia-Pacific Conference on Advanced System Integrated Circuits (AP-ASIC2004) Aug. 4-5, 2004, pp. 2-5.

O'Riordan Alan, "Filed Configured Assembly: Programmed Manipulation and Self-assembly at the Mesoscale" NANO Letters. vol. 4, No. 5, May 2004, pp. 761-765.

Jonas Ulrich, "The Effect of Polar, Nonpolar, and Electrostatic Interactions and Wetting Behaviour on the Particle Assembly at Patterned Surfaces" Journal of Supramolecular Chemistry 2 (2002) pp. 255-270.

Jacobs Heiko O. "Fabrication of a Cylindrical Display by Patterned Assembly" Science AAAS, Science 296, 323 (2002).

Whitesides George M. "Self-Assembly at All Scales" Science AAAS, Science 295, 2418 (2002).

Srinivasan Uthara, "Microstructure to Substrate Self-Assembly Using Capillary Forces" Journal of Microelectromechanical Systems, vol. 10, No. 1, Mar. 2001, pp. 17-24.

Alien "Fluidic Self Assembly" Alien Technology Corporation, Oct. 1999, pp. 1-7.

Murakami Yuji, "Random Fluidic Self-Assembly of Microfabricated Metal Particles for the immobilization of Biomaterial" The school of Materials Science, Japan Avandce Institue of Science and Technology, Transducer '99 Jun. 7-10, 1999 Sendai, Japan, pp. 1108-1111.

* cited by examiner

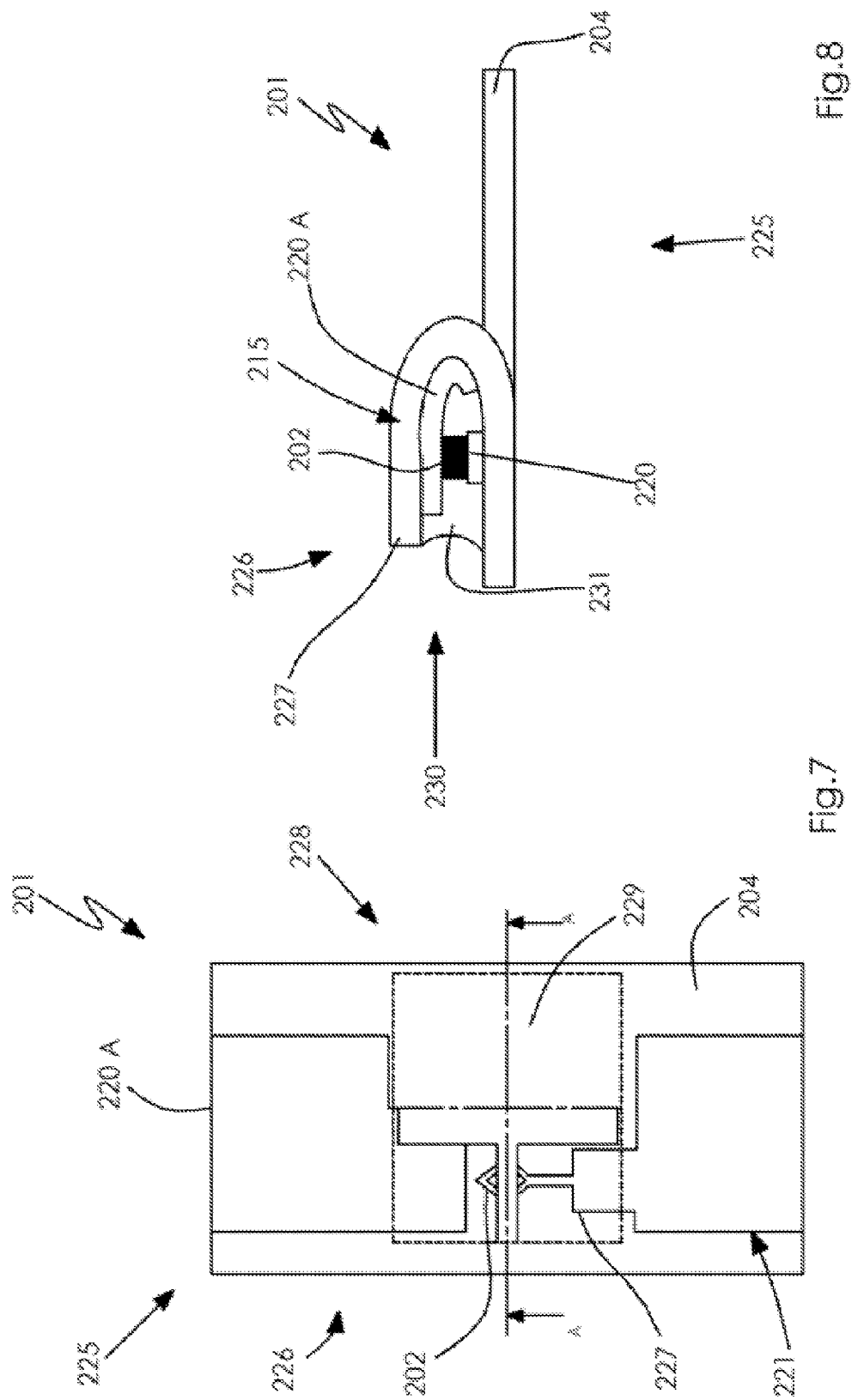

METHOD AND APPARATUS FOR MANUFACTURING AN ELECTRONIC ASSEMBLY, ELECTRONIC ASSEMBLY MANUFACTURED WITH THE METHOD OR IN THE APPARATUS

CROSS-REFERENCE TO RELATED APPLICATIONS

This application is a National Stage application of International Application No. PCT/EP2009/008558, filed Dec. 1, 2009, which claims priority to German Patent Application Serial No. DE 10 2008 062 211.7, filed Dec. 13, 2008, German Patent Application Serial No. DE 10 2009 020 540.3, filed May 8, 2009, and U.S. Provisional Application No. 61/176,521, filed May 8, 2009.

BACKGROUND

A method for producing an electronic module is presented here; in it, an electronic component is deposited on a carrier substrate. The carrier substrate can be flexible. A device for producing an electronic module is also presented. Finally, an electronic module with a carrier substrate, e.g. made of a flexible foil substrate and with an electronic component, around which a folded area on or from the carrier substrate is folded, arranged on it, is described.

PRIOR ART

Currently, smaller electronic components such as active and passive elements such as semiconductor chips with two or more (up to a few hundred) connections, resistors, capacitors, power semiconductors (transistors, thyristors, TRIACs), light-emitting elements (LEDs), etc. are seized by mechanically working gripping and depositing robots and positioned precisely in multiple dimensions (longitudinally, transversely, angular position, etc.) on a suitable wiring carrier, to produce an electronic module. Self-aligning effects of the components are usually irrelevant. On the contrary: in the method which has been usual until now, of depositing the components at their assembly and contacting position as precisely as possible, self-aligning effects are interfering, and are therefore avoided as much as possible. The electronic components are often contacted by a flip-chip method, e.g. in association with ACA (anisotrop conductive adhesive) or ACF (anisotrop conductive foil/film), pressure and heat being supplied. However, production speed is limited, on the one hand, by the required indexers, and on the other hand by the placing of the individual components. Also, because of the danger of breaking, very thin components can be processed in this way only with difficulty or a high rejection rate. Handling very thin components with gripping and depositing robots is also difficult.

The possibility of placing individual components on the wiring carrier by means of a self-aligning effect on a suitable fluid which has previously been deposited on the wiring carrier has been discussed before (Conference on Smart System Integration 2008, 8-9 Apr. 2008, Barcelona, in the presentation "Contactless Device Handling—New Assembly Approaches for the Micro-Nano-Integration", K.-F. Becker, J. Bauer, G. Mollath, G. Schreck, I. Kolesnik, E. Jung, H. Reichl, J. Lienemann, D. Kauzlarić, J. Korvink).

JP 2005115916 A describes a method for producing an RFID semiconductor component, wherein an RFID chip is mounted mechanically on a metallic transmitter and receiver structure of a carrier material, by means of a traditional flip-chip method. The carrier material is then folded. A similar method for producing an RFID semiconductor component is described in the publication "An Ultra-Small RFID Chip: μ-chip" by Mitsuo Usami (2004 IEEE Asia-Pacific Conference on Advanced Systems Integrated Circuits (AP-ASIC2004/Aug. 4-5, 2004), in which an RFID chip, which is provided with electrical connections on both sides, is covered on both sides. On the one hand, the RFID chip is connected to a first, thin aerial of an anisotropic, electrically conducting film, called ACF (anisotrop conductive film/foil) for short, and covered, the anisotropic, electrically conducting film forming the carrier substrate of the RFID semiconductor component. On the other hand, the RFID chip is connected to a second, thin aerial of a further thin metal foil, and covered, the further thin metal foil being folded so that the further thin metal foil is fixed to the underside of the ACF. Thus the RFID chip is covered on both sides by a thin aerial. Since both an anisotropic, electrically conducting film and an additional metal foil are required for producing an RFID semiconductor component, the RFID semiconductor component is decidedly expensive to build.

DE 19962194 A1 describes a method for producing contactable conductor loops for transponders, with the following steps: Form a conductor loop with multiple windings on one side of a ductile substrate. At first the conductor loop has an inner and an outer end, the inner end being within the conductor loop and the outer end outside it. Extend the conductor loop, starting from the outer end, by a predetermined piece, which is directed outward relative to the conductor loop. Fold the substrate between the extended outer end and the outer end, in such a way that the extended outer end, after folding, is above that area of the substrate which is defined by the inside of the conductor loop.

DE 602004007861 T2 describes a method for producing a communication medium, a base layer being unwound from a first roller, an IC chip being bonded to each of multiple transmission and reception aerials on an area of the base layer, and the base layer then being wound onto a second roller. Between unwinding and winding the base layer, the following steps are carried out: Bond an IC chip to each aerial on the base layer, forming multiple arrangements each with one aerial and one IC chip. Test a communication power of each arrangement individually, and sort the arrangements according to their qualities. Form a rectangular cut area on the base layer, in an intermediate space between adjacent arrangements. Cover one of the adjacent arrangements correspondingly with the cut area, by folding the cut area over one arrangement. Further technological background can be taken from DE 10151657 C1, DE 10 2006 001885 A1, EP 1 143 378 A1.

Underlying Problem

The aim is to provide an method which is improved compared with previous methods for producing electronic modules, and which (i) can be used in mass production, (ii) allows a higher assembly throughput, and (iii) offers low-stress feeding to highly precise placing for the components, to make subsequent easy electrical contacting of multiple electrical connections of the component to its electrical environment possible.

Solution

To achieve this aim, a method with the features of claim 1 is proposed here. This method makes it possible to produce an electronic module with at least one electronic component and one carrier. On the carrier, a structure which is suitable for aligning a component on it is provided, so that the component can take a desired target position relative to the structure. This structure is coated with a material to form a liquid meniscus. The liquid meniscus is suitable for receiving the component at least partially. A stock of multiple components is provided at a delivery point for the components. The carrier, with the structure, is moved at least to nearby opposite the delivery point. The delivery point delivers one of the components without contact, while the structure on the carrier is near the delivery point or moving past it, so that after a phase of free movement the component at least partly touches the material. During the phase of free movement, the electronic component is not held or guided mechanically by any mechanical device. The carrier, with the structure, is moved to a downstream processing point, while the component (driven by interactive effects from capillary forces, wetting and surface tension) aligns itself to the structure on the liquid meniscus, and takes its target position.

With this method, mass production of semiconductor components of the type described above is significantly less expensive, faster, more reliable and associated with less stress for the components than is the case with the methods which were previously normal in industry. This applies in particular to assembly and housing cladding for chip elements with few electrical contacts (e.g. RFIDs, LEDs, etc.) on foil substrates (e.g. on transponder interposers or inlays for RFIDs) at high speeds and with high reliability. These advantages become evident, in particular, in the case of assembly of very small and/or very thin chip elements, because of the conceptual differences from previous procedures: no direct touching of the chip elements in the assembly process, and self-alignment of chip elements which are fed in only approximately, exploiting interfacial surface tension effects.

Although the chip elements, at the time when they are delivered, are positioned in the delivery point only with low precision relative to their target position, the subsequent self-alignment causes precise positioning. Subsequently, therefore, very efficient, reliable electrical contacting is possible. Additionally, because of subsequent folding of a part of the substrate onto itself, high resistance of the whole arrangement to mechanical stresses and humidity can be achieved.

Self-alignment does without the servo loops which are necessary in the prior art, with expensive image recognition systems to detect the position of the chip elements, and very precise active positioning, controlled by them, in multiple co-ordinates and/or angular positions. Because of the contactless delivery of the chip elements, they are less stressed mechanically. The process can therefore run continuously; it does not have to run at the rhythm of the gripping and depositing robots, as in the prior art. Although continuous transport of the carriers, e.g. on a carrier tape, is advantageous and preferred, it is by no means obligatory. Instead, it is also possible—e.g. because upstream or downstream processing points work in a discontinuous or clocked manner—to feed the carriers in and remove them, as described above, in a discontinuous or clocked manner, i.e. in steps. Additionally, this procedure, which is conceptually completely different from the prior art, manages with significantly less cost in apparatus than the prior art. This reduces the production, adjustment and maintenance costs considerably.

Small, active or passive electronic components with few electrical contacts on one component side (e.g. RFIDs) and those with contacts on the top and underside (e.g. LEDs) can be mounted very quickly. The method also makes possible completely continuous roller-to-roller processes, in which the tape with the carriers does not have to be stopped. The method also makes possible a clear throughput increase compared with processes which are currently used in industry for assembling electronic elements (e.g. RFID chips) on structured, flexible substrates. The method also makes possible low-cost packaging of other elements on structured foil substrates, and can easily be adapted to different chip types.

The carrier substrate which is provided with a structure, i.e. the carrier, can be made of a polymer film (e.g. PET, PEN, PI) or an alternative, also flexible substrate material (e.g. paper, compound materials) with an applied conductive structured coating (e.g. copper metallisation, aluminium metallisation, printed silver conductive ink, etc.). The delivery of the chips and their self-alignment in a liquid meniscus can also be applied on rigid carriers, e.g. printed circuit boards.

The structure can be formed on the carrier by applying material to a surface of the carrier, or by removing material from a surface of the carrier. The shape of the structure can be adapted to the contour of the electronic component. Through the structure, the target position of the electronic component can be fixed in one or more dimensions (X, X and/or Z direction) and/or its orientation can be fixed in one or more directions (angular position).

The structure can also be in the form of a structure, on the carrier, having multiple substructures, each of which delimits an area, to form a liquid meniscus in each case.

Because of the structuring, the surface of the substrate is shaped so that it can be wetted selectively with the material. The material which is put into this structure to form the meniscus can be a liquid, an adhesive or a solder, which still has to be melted. In this liquid state, the material/solder forms a meniscus. The shape of the structure is similar or adapted to the base area of the chip, which makes self-alignment of the chip to the structure possible.

The carrier surface, which is defined by the structure and can be selectively wetted, can be selected depending on the material (e.g. adhesive, acrylate adhesive, epoxy adhesive, water, flux, organic solvents or mixtures of them). To produce surfaces which can be wetted in a structured manner, for example, but not exclusively, structured metallisations (e.g. for processes with solder); plasma treatments (e.g. for processes with acrylate adhesive or water); production of a surface topography by stamping, punching or additive methods; additive application of silicones, resins or waxes (e.g. for processes with acrylate adhesive, adhesive, water, flux, organic solvents and mixtures of them); and the combination of several such methods are possible.

For self-alignment of the electronic elements on the structured carrier substrate, the effect of minimising the free interfacial energy of a system of locally structured carrier substrate, fluid and element is used.

The components which can be processed are electrical and/or electronic elements for a semiconductor component which can be deposited on a preferably flexible carrier substrate. Such components are also called chips.

The carrier substrate can be present in any form which is suitable for production of a semiconductor component. The carrier substrate can be flexible, and elastically or plastically ductile without destruction. Such a flexible carrier substrate can be a film substrate which can be folded into itself in such a way that two adjacent areas of the film substrate can be folded onto each other. A carrier tape can be moved continuously with multiple carriers, which each have the structure, to nearby opposite the delivery point for the electronic components, and away from there.

The material can be of such a form, and/or delivered to the structure in such a quantity, that the liquid meniscus is formed convexly relative to the structure. In subsequent processing, the material may have to be removed at least partly from the structure. The material can also be an adhesive, which at least partly remains between the structure and the component. The material can also be a solder, which must be melted on. If, before the carrier moves with the structure to a downstream processing point, the solder, which includes flux, is melted as the liquid meniscus is formed, the electronic component which is in contact with the liquid meniscus can align itself on the structure and take its target position.

The electronic component can be a semiconductor chip with metallic connecting contacts, which are arranged on one side surface, or two opposite side surfaces, of the semiconductor chip, the electronic component being delivered from the delivery point in such a way that a side surface with metallic connecting contacts faces the material, and a side surface without connecting contacts faces away from the material. Alternatively or additionally, a side surface with metallic connecting contacts can face the material, and a side surface with metallic connecting contacts can face away from the material. Alternatively or additionally, at least one side surface with metallic connecting contacts can be oriented transversely to the surface of the material.

Multiple electronic components can be fed to the delivery point adhering to a carrier layer as isolated semiconductor chips, in which case the isolated semiconductor chips adhere to a side of the carrier layer facing the carrier.

For contactless delivery, an energy of such a type and quantity can be directed onto an individual semiconductor chip, from a side of the carrier layer facing away from the adhering semiconductor chips, through this carrier layer, in such a way that the semiconductor chip separates or detaches itself from the carrier layer, then to contact the material and/or its liquid meniscus at least with part of one of its side surfaces. This energy can be provided by an (infrared) laser, a hot gas jet (e.g. a hot air jet), a radiant heater element or similar. The energy source can also touch the carrier layer; since the energy source is arranged on the side of the carrier layer facing away from the semiconductor chips adhering to the carrier layer, the semiconductor chips adhering to the carrier layer are nevertheless not touched during the transfer from the delivery point to the material/structure.

The carrier layer can be provided with an adhesive layer for the isolated semiconductor chips. This adhesive layer can at least partly disintegrate because of the effect of at least part of the energy which is directed onto the individual semiconductor chips, to exert a mechanical impulse onto the appropriate semiconductor chip, moving the appropriate semiconductor chip away from the carrier layer. Alternatively or additionally, the adhesive layer can include densely arranged small particles, e.g. small capsules containing a liquid, which expand with the effect of energy, become bubbles, lift the semiconductor chip, enlarge the interface to the semiconductor chip, and thus detach it from the adhesive layer.

The energy which is supplied locally as described above is partly or completely converted into heat in the semiconductor chip which is to be separated from the carrier layer, in it and/or in the carrier layer. The effect of this heat is that the adhesive layer, which is between the semiconductor chip and the carrier layer, and which reacts to heat, releases the semiconductor chip from the adhesive layer, since the adhesive layer is the adhesive/capsule mixture of a thermally dissolving film. It is also possible that the adhesive layer itself (or the carrier layer, or the semiconductor chip which is to be separated from the carrier layer) converts the supplied energy into heat according to the absorption of the wavelength of the energy radiation, converts it into heat and thus accelerates the thermal reaction.

The carrier can be formed from an elastically or plastically ductile material, which is provided with an electrically conducting pattern, which has at least one path. The electrically conducting path can either be in such a form that it reaches so far into the structure that it contacts one of the connecting contacts of a semiconductor chip after this semiconductor chip has (self-)aligned itself (on the liquid meniscus) on the structure. The electrically conducting path can also be formed so that it reaches into an area of the carrier at a distance from the structure. In this case, a perforation or weakened point is made in the area of the carrier around part of the path of the pattern, to form a flap which contains part of the path. The flap is then removed from the carrier, and next the flap is folded so that the part of the path on the flap contacts at least part of one of the connecting contacts of a semiconductor chip. Alternatively, a perforation or weakened point can be made in the area of the carrier, to form a flap which contains the semiconductor chip. The flap can then be removed from the carrier, and next the flap can be folded so that the semiconductor chip on the flap contacts at least part of the path of the pattern with at least one of its connecting contacts.

The foldable folding area can be delimited from the rest of the carrier in many different ways. For instance, mechanical methods such as punching, cutting, notching, scribing, stamping and/or perforation are suitable for the purpose. However, laser-supported methods such as cutting, notching or perforation, with which suitable delimitation can take place reliably and quickly, are also possible. But water jet cutting methods or similar are also possible.

One or more foldable folding areas can be separated from the flexible carrier substrate, in which case at least one connection of the thus separated foldable folding area to the flexible carrier substrate remains, so that the result is a clip or flap. For instance, a rectangular clip is produced by three completely separated boundary edges and one boundary edge which is not or only partly separated, perforated, notched or otherwise weakened. Other geometrical forms of clip are also possible, e.g. an almost arbitrary rectangle, a curve or a free form.

To form the flap, the carrier substrate can be folded in both the direction of movement of the path from roller to roller and transversely to it.

Because of the foldable folding area, the component can easily be received, in a sandwich construction, between two layers of the flexible carrier substrate, by which means the component can be protected specially well against environmental effects.

The space which contains the semiconductor chip, between the carrier and the flap, can be filled with a filler, so that the semiconductor chip is at least partly embedded in the filler. This can be a suitable adhesive, by which means a specially high ability of the semiconductor component to withstand mechanical stress can be achieved. In this way, the component is also additionally protected.

The foldable folding area, with the electronic component arranged on it, can also be folded onto the (metallic) structure.

Since the electronic component is deposited on the carrier substrate without contact by this method, mechanical mounting—as used in industry until now—of the component, by means of a mechanical gripper or sucker which grips the component and places it on the carrier substrate, is omitted. Placing the component is thus significantly faster, and in particular for thin components (about 10 μm thickness or less) mechanically less stressing than before.

In particular, this method is suitable for semiconductor components in which semiconductor chips are equipped with a manageable number of electrical connections. However, this method is equally suitable for semiconductor components with multiple electrical connections, e.g. logic, controller or processor connections.

Through the contactless delivery (or depositing), the component reaches the carrier (substrate). After the component has left the stock, for a moment (phase of free movement, the free phase or free flight phase or free fall phase), before it has reached the material in the structure on the carrier, it is not held or guided mechanically by any mechanical device. Thus the component can be deposited in free fall on the carrier substrate, for instance. In this case the component can be deposited on the carrier substrate because of nothing or almost nothing but gravity, so that this method can be in specially simple form.

The electronic component can also be accelerated to the carrier without contact. For instance, the component can be additionally accelerated by means of compressed air support, and thus deposited more effectively on the carrier substrate. For instance, such compressed air support can take place by the adhesive layer for holding the components being heated so much that constituents of the adhesive layer go into the gas phase, and act as a driving force between component and carrier layer.

Because of the structure on the carrier, it is divided into an area which can be wetted/is covered by the material and an area which cannot be wetted/is not covered. In particular, the area which can thus be selectively wetted can be distinguished in that a liquid on it can form, on the carrier, a meniscus, the form/shape of which is adapted to the base of the component, thus making self-alignment of the component on the structure possible.

The shape of the area which can be wetted can depend on the material which is used and on the component.

To produce a surface which is structured and can be wetted on the carrier, for instance, but not exclusively, structured metallisations, e.g. for processes with a solder, plasma treatments, e.g. for processes with an acrylate adhesive or water, can be provided. In this case, the structure can be produced as a specific, e.g. annular, surface topography, e.g. by stamping, punching or additive methods, e.g. an additive application of silicones, resins and/or waxes, and the combination of multiple such methods. The structure can also be in the form of an annular electrical track.

The component on the carrier substrate can easily be connected electrically to further functional components, if the carrier substrate has a correspondingly patterned electrically conducting structure. Therefore, before and/or while the component is deposited, the carrier substrate can be coated, e.g. printed, with an electrically conductive structure, in particular a metallic structure. In particular, the wettable area can advantageously be produced on the flexible carrier substrate by means of an electrically conductive structure.

Liquids of low viscosity make sufficiently fast self-alignment of the component easier. In a simple case, water, which ideally evaporates completely after successful alignment of the electronic component, can be used for alignment, after which a solder or a highly viscous adhesive can come into contact with the aligned component. In this case, the solder or the highly viscous adhesive take over permanent fixing and/or contacting of the component on the carrier substrate.

As the means for aligning the electronic component, an adhesive with a similar viscosity to water can be used. In this way, on the one hand, an electronic component can be aligned on the structure on the carrier substrate with an adhesive, and on the other hand it can be fixed on the carrier substrate with the adhesive.

An adhesive with a viscosity which differs from the viscosity of water by less than 30%, preferably less than 10%, allows sufficiently fast alignment of the electrical component, in particular before the electrical component is stuck fast.

Self-alignment also functions with adhesives of higher viscosity, even if in this case it runs correspondingly more slowly. Care must therefore be taken that the adhesives of higher viscosity are not cured until a later time than those of low viscosity, so that the electrical component is not stuck fast until after alignment. However, this variant allows a component to be both aligned and fixed permanently to the carrier substrate by the adhesive.

If the material which is used has a specially good wetting effect, for instance the adhesive can reach corners of the structure to be wetted of the surface area. The effect of this is good angular alignment of the electrical component, since effective angular alignment begins, in particular, with the corner areas of the structure.

A rectangular or square adhesive deposit on the substrate can result in a specially good angular alignment of the component (which usually also has a rectangular or square outline), so that specially high precision and reproducibility of the alignment, in particular of a rotatory and/or translatory self-alignment, of the component can be achieved.

In a variant of the method, the component is deposited on the foldable folding area. For instance, the component is deposited on a foldable folding area which is acted on by suitable connecting means and/or by means for aligning the electronic component, with that one of its sides on which no electrical connections of the component are provided, and which is opposite, facing away from the connections. In this way, for instance, the component can align itself specially well on the meniscus-forming material on the foldable folding area, before the foldable folding area is folded onto the carrier substrate. Because of the folding, the electrical connections of the electronic component can be connected electrically to an electrically conductive structure, so that a functional semiconductor component can be produced.

Preferably, the foldable folding area is in a significantly smaller form than the other areas of the flexible carrier substrate, so that the other areas are not completely covered by the flap.

The component can be contacted electrically and fixed mechanically with or without additional materials or connecting materials such as means for bonding and/or to aligning the electronic component, merely by folding the carrier. In this case the electrical contacting can be carried out by means of solder, ICA, ACA, ACF or bumps with sufficient surface roughness, e.g. stud bumps or Pd bumps and NCA. For contacting different electrical connections of the component, different connecting materials can also be used.

Altogether, by folding the folding area of the carrier, the component can not only be advantageously fixed on the carrier, but also contacted with electrically conductive structures.

The features or feature combinations of the foldable folding area represent an independent further development of traditional methods of producing a semiconductor component, and can be used even without the other features described above.

According to them, a semiconductor component can be formed from a film substrate and an electronic component which is arranged on it, in which case a foldable folding area is formed on the film substrate. In this case the position of the foldable folding area can be determined exceptionally precisely, which is advantageous in particular in the case of specially small semiconductor components.

A semiconductor component can be constructed even more compactly if the chip is not on but next to the clip, and it is not the chip but connecting areas on the clip, with tracks which require less space than the chip, which are folded onto the chip.

On the one hand, the semiconductor component in this form is significantly more simply constructed than the RFID semiconductor component which is shown in the above-mentioned publication, since this semiconductor component consists merely of a single film substrate, by means of which two layers, between which the electronic component is embedded, are created.

On the other hand, this semiconductor component also differs from the semiconductor component from the published specification JP 200511916 A cited above, since here only a small folding area of the single, flexible film substrate is folded.

If the base area of the folding area is more than a third, preferably more than half, smaller than the base area of the semiconductor component, only a smaller folding area must be folded. In particular, in this way electrically conductive structures on the single, flexible film substrate can remain uncovered by the folding area which is folded onto them. For instance, the transmission and/or reception power of an RFID semiconductor component can be improved in this way.

The film substrate of the semiconductor component can still be built very stably even in the case of a folded folding area, if the foldable folding area forms a window area within the single, flexible film substrate. The window area describes a material recess which results within the film substrate when the folding area is folded. The window area or material recess is still completely bordered by the rest of the film substrate. In other versions, the material recess also does not have to be completely surrounded by the film substrate.

In one variant, the component which is arranged on the film substrate is fixed on the foldable folding area so that it can be folded relative to the film substrate. In this way, the component can easily be folded, e.g. with the foldable folding area, onto a metallic structure, with which the film substrate can at least partly be coated.

The component can be well aligned and fixed on the carrier, if it is aligned and/or fixed on the carrier by means of a material which forms a liquid meniscus. Preferably, suitable material deposits can be applied in an air atmosphere. The material can also be electrically conducting, so that the component can also be connected electrically to electrically conducting structures.

In another variant, the material is electrically insulating. In this case electrical connection of the component can only be achieved by folding the foldable folding area, namely when electrical connecting devices of the component come into contact with an electrical structure of the flexible carrier substrate.

A special solution proposes a method of producing a semiconductor component with a component, wherein a metallic structure is deposited on a surface of a flexible film substrate, and wherein the film substrate which is structured in this way can then be fed to a continuous assembly process such as a roller-to-roller assembly process, wherein a foldable folding area is inserted into the structured film substrate, wherein connecting means are deposited on the folding area, wherein the component is deposited on the connecting means in the folding area, and wherein the component aligns itself, with the connecting means, on the surface on the structure on the film substrate, and wherein the folding area, together with the component, is folded onto the metallic structure, so that the component is also connected electrically to the metallic structure. This allows very efficient, inexpensive mounting of a component of almost any form on a preferably flexible carrier substrate.

The particular distinguishing feature of the roller-to-roller assembly process described here is that an assembly tape which is moved along an assembly track ideally never has to be stopped or slowed down to carry out an assembly step on the semiconductor component. Thus this method makes a clear throughput increase compared with today's clocked processes for mounting elements on structured carriers.

The methods or method variants described here also make it possible to assemble specially small electronic components with few electrical connecting devices, in particular also in association with transponder-interposers or inlays for RFID. Because of the contactless assembly of the components and their self-alignment on the carrier, even in the case of assembly of very small and/or very thin components, high production speed with high reliability can be ensured.

The electronic component can have more than one electrical connection, e.g. two to four electrical connections. The component can also have fewer than ten electrical connections, preferably fewer than five electrical connections. Here it is irrelevant whether the electrical connecting devices are on only one chip side, as for instance in the case of currently available RFID chips, or on two chip sides, as for instance in the case of currently available LED chips.

To carry out the method described above, for instance a device with a facility for providing a structure on the carrier can be used, in which case the structure must be shaped by the facility so that it is suitable for aligning an electronic component on it, so that the component can take a desired target position relative to the structure. This structure providing facility can be a printing unit, a stamping unit, or similar. A facility for loading the structure with a material for forming a liquid meniscus is also provided, the liquid meniscus being suitable for receiving the component at least partially. A receptacle for a stock of multiple components is also present at a delivery point for the components. A first conveying facility moves the carrier, with the structure, at least to nearby opposite the delivery point. An energy feed facility initiates contactless delivery of one of the components from the stock of the delivery point, while the structure on the carrier is moving past near the delivery point, so that after a phase of free movement the component at least partly touches the liquid meniscus. During the phase of free movement, the electronic component is not held or guided mechanically by any mechanical device. The conveying facility moves the carrier, with the structure, to a downstream processing point, while the component aligns itself to the structure on the liquid meniscus, to take its target position.

The conveying facility of the device can be driven transport rollers or porcupine rollers, which continuously convey a carrier tape with multiple carriers, each of which has the structure.

The facility for providing the structure on the carrier can be set up to form this structure either by applying material to one surface of the carrier or by removing material from one surface of the carrier. For instance, this can be a rotary printing unit, with which an annular structure of silicone, wax or similar is printed on each carrier.

A facility for loading an apportioning facility can be provided, to deliver the material in such a form and/or such a quantity to the structure that the liquid meniscus is formed convexly relative to the structure. The material can also be a solder which includes flux and must be melted on. If the material is a solder, a heating facility to melt the solder can be provided. When the carrier with the structure moves to a downstream processing point, it melts the solder, forming the liquid meniscus, so that the electronic component in contact with the liquid meniscus aligns itself on the structure and takes its target position.

In subsequent processing, if the material is to be at least partly removed from the structure, a heating facility or similar can be provided, to expel the material at least partly from the structure.

The receptacle can have an adjustment facility which can be positioned in at least two dimensions. It can be set up to position the carrier layer, with the semiconductor chips adhering to the carrier, in these two dimensions, in such a way that in each case one of the semiconductor chips is near an opposite structure at a distance.

The energy feed facility can be a heat energy source which is in the form of a heat radiator or head conduction source, and which is set up to deliver the heat energy of a side of the carrier layer facing away from the adhering semiconductor chips through the carrier layer to an individual semiconductor chip, in such a way that the semiconductor chip separates from the carrier layer, and afterwards contacts the liquid meniscus with at least part of one of its side surfaces.

The adjustment facility is set up to position the carrier layer in at least two dimensions in such a way that an adhesive layer on the carrier layer is able to hold the isolated semiconductor chips. The semiconductor chips can adhere to the carrier layer, by means of the adhesive layer, in such a way that their electrical connections face away from the carrier layer or towards the carrier layer.

A facility for forming a perforation or weakened point of the carrier can be present, to form a flap in an area of the carrier, which is formed of an elastically or plastically ductile material. A facility for removing/pushing out the flap from the carrier can also be present. Finally, a facility can be present to fold the flap so that under the flap, at least part of one of the connecting contacts of a semiconductor chip, and the carrier contact each other.

Also, a filling device for a filler can be present, to fill a space between the carrier and the flap, containing the semiconductor chip, with filler, in such a way that the semiconductor chip is at least partly embedded in the filler.

Finally, an electronic module, which is obtainable according to the method claimed above and/or with the device claimed above, with at least one electronic component and one carrier, is described here. On the carrier, a structure on which the electronic component is aligned in its target position is arranged. Between the carrier and the electronic component, there is a material on which the electronic component is received.

On the carrier, by applying material to one surface of the carrier or removing material from one surface of the carrier, the structure for aligning and receiving the electronic component is formed. The shape of the structure is adapted to the contour of the component, and/or fixes the target position of the component in one or more dimensions and/or its orientation in one or more directions.

The structure can be in the form of a structure having multiple partial structures, each of which delimits an area and receives the material, on the carrier. The material can be an adhesive, which at least partly remains between the structure and the component, or the material can be a solder which includes flux and is to be melted.

If an adhesive filled with flux, a so-called "no flow underfill", is additionally applied on the contacting position of the substrate or on the surface of the chip on which the contact bumps are, this improves the contacting and also contributes to the mechanical strength of the connection between chip and carrier substrate.

In the case of the electronic module, the electronic component can be a semiconductor chip with metallic connecting contacts, which are arranged on one side surface, or two opposite side surfaces, of the semiconductor chip. A side surface of the electronic component with metallic connecting contacts can face the material, and a side surface without connecting contacts can face away from the material.

Alternatively, a side surface of the electronic component with metallic connecting contacts can face the material, and a side surface with metallic connecting contacts can face away from the material. In a further variant, at least one side surface of the electronic component with metallic connecting contacts can be oriented transversely to the surface of the material.

In the case of the electronic module, the space which contains the semiconductor chip, between the carrier and the flap, can be filled with a filler, so that the semiconductor chip is at least partly embedded in the filler.

BRIEF DESCRIPTION OF THE FIGURES

Further features, properties, advantages and possible modifications become clear to a person skilled in the art on the basis of the description below, which refers to the attached drawings.

FIG. 7 shows schematically a plan view of a further interposer with a flipped LED chip;

FIG. 8 shows schematically a cross-section view of the interposer from FIG. 7, along the section line A-A in FIG. 7;

DETAILED DESCRIPTION OF THE FIGURES

Examples of process chains of the method (variants) presented above, in particular also for roller-to-roller processing of a flexible substrate into a flexible carrier (substrate), which is populated with small electronic elements, are shown in the figures.

Figure 1:
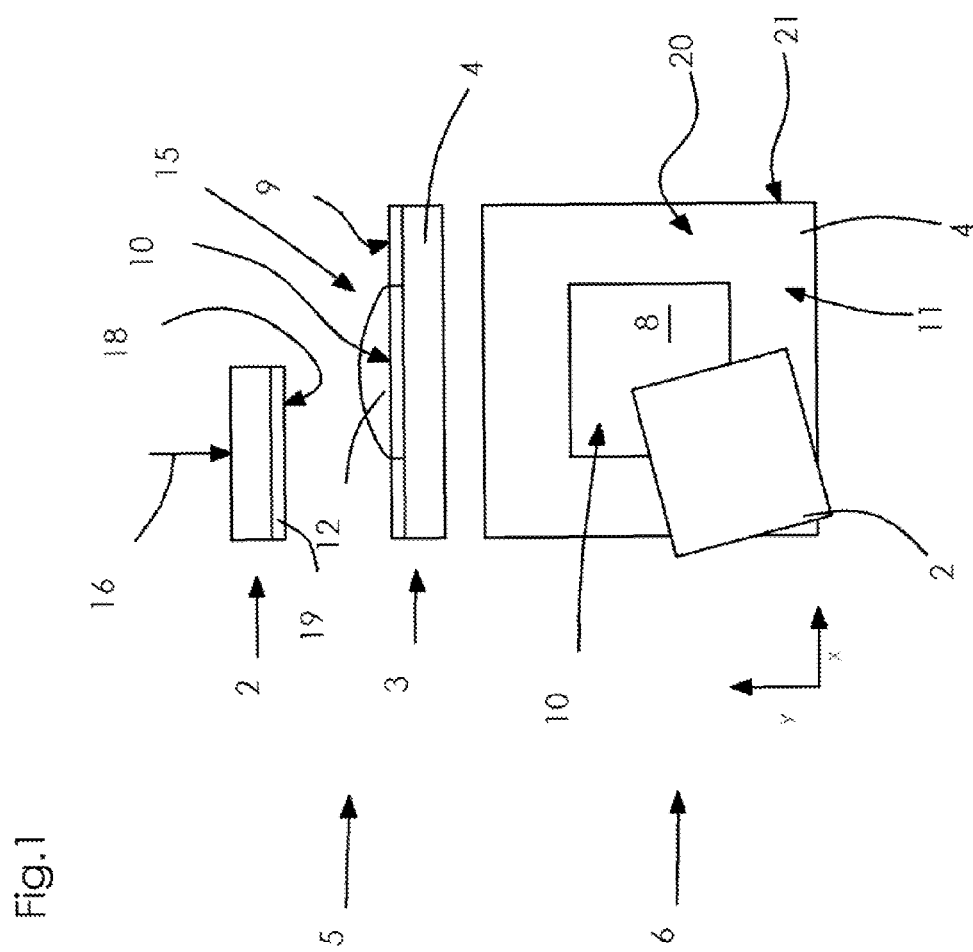
FIG. 1 shows schematically a method step, in which a chip element is fed to a film substrate without contact.
Figure 2:
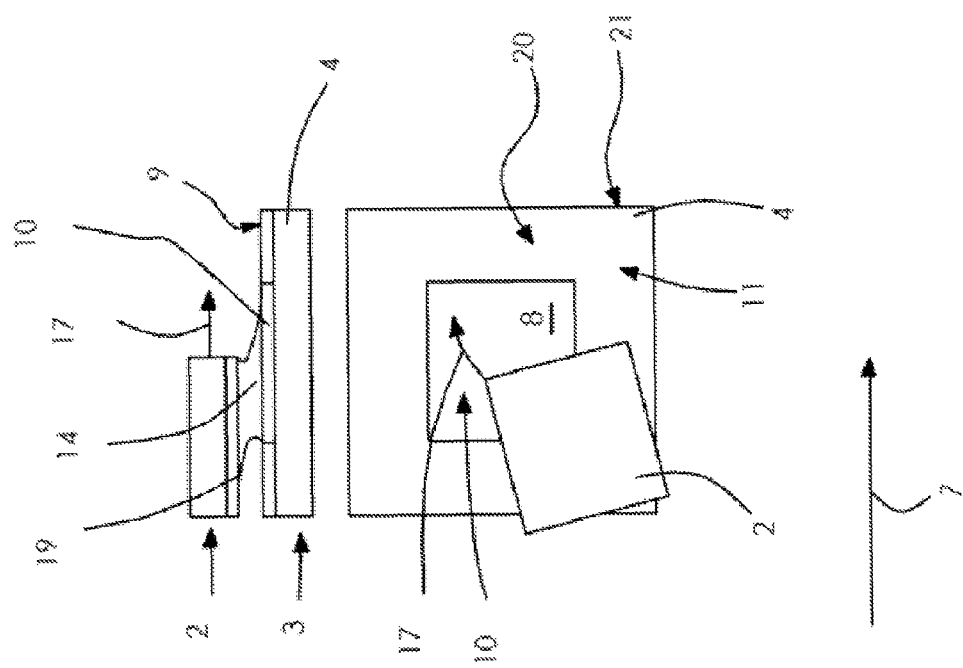
FIG. 2 shows schematically a further method step, in which the chip element is aligned on the film substrate by an alignment means.
Figure 3:
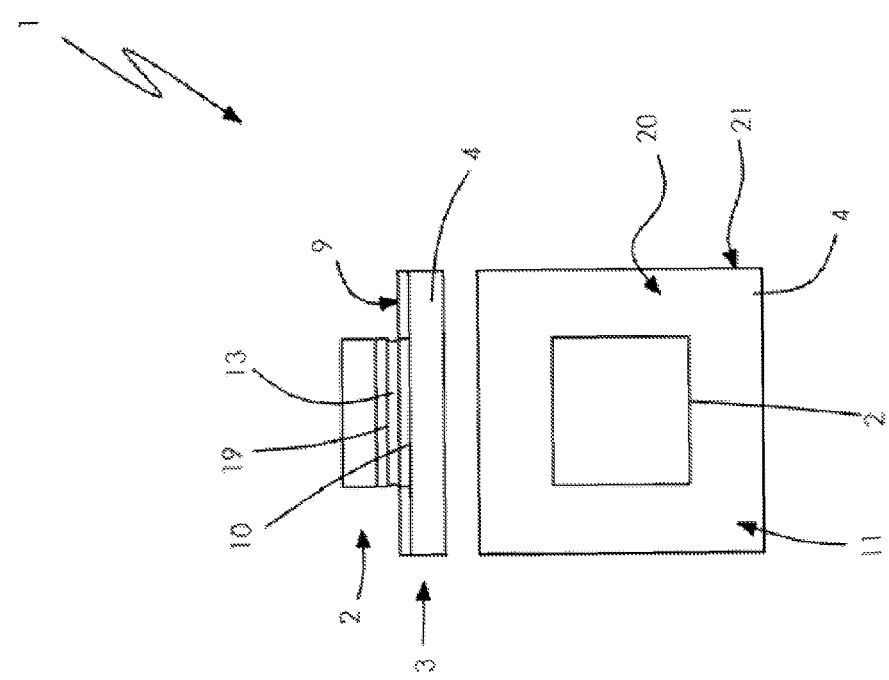
FIG. 3 shows schematically a subsequent method step, in which the chip element is permanently fixed to the alignment means on the film substrate.

In the method flow shown in FIGS. 1 to 3, for producing a semiconductor component 1 (see FIG. 3), a chip 2, as an electronic component, is deposited on a carrier substrate 3 without contact, the flexible carrier substrate 3 here being in the form of a flexible film substrate 4.

FIGS. 1 to 3 are divided into upper side views 5 and plan views 6 shown below them, and the method progresses from left to right in the direction of the arrow 7.

FIG. 1 shows a square footprint zone 8 which is formed on the film substrate 4, and the area shape of which is adapted to the area shape of the chip 2. The chip 2 is an electrical or electronic component element.

The film substrate 4, on its surface 9 facing the chip 2, is divided into a wettable area 10 and a non-wettable area 11, the wettable area 10 being essentially the square footprint zone 8 on the flexible film substrate 4. In the wettable area 10, a material 12 can be deposited as a connecting means 13, and to align the chip 2 on the flexible film substrate 4. The material 12 is distributed in the wettable area 10 into a fluid deposit 15, and forms a liquid meniscus 14 which is convex in plan view.

Now, if the chip 2 is moved in free fall 16 contactlessly onto the flexible film substrate 4, and thus deposited on the liquid meniscus 14 of the material deposit 15 (see FIG. 1), the chip 2 comes into contact with the material 12 (see FIG. 2). Because of the effect 17 of the minimisation of the free interfacial energy in the area of the material 12, the chip 2 is aligned on the flexible film substrate 4 relative to the square footprint zone 8 in such a way that the chip 2 is brought to cover the square footprint zone 8 or the wettable area 10. In particular, this succeeds very well if, on a chip side 18 facing the square footprint zone 8, a very wettable chip surface 19 with respect to the material 12 is provided. In this variant, the material 12 is a heat-curable adhesive with low viscosity.

After the self-alignment on the adhesive deposit 15, the adhesive 12 can cure, and the chip 12 is flipped (turned round) on the flexible film substrate 4, so that the semiconductor component 1 is available for further processing, e.g. for contacting the electrical connections of the chip 2 facing away from the carrier (see FIG. 3).

In this embodiment, the unwettable area 11 is formed by means of a metallic structure 20, which is deposited on the flexible film substrate 4. In this respect, the square footprint zone 8 is completely surrounded by the metallic structure 20, so that the fluid 12 can be positioned in a defined manner on the flexible film substrate 4.

The metallic structure 20 also defines a reference edge 21, starting from which further method steps can be referenced, on the flexible film substrate 4, so that specially high precision can be guaranteed for the semiconductor component 1.

Figure 5:
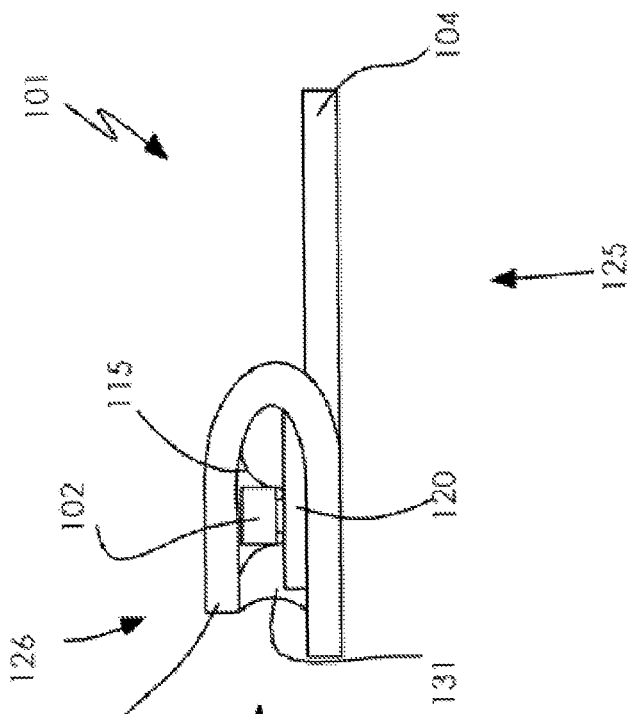
FIG. 5 shows schematically a cross-section view of the interposer from FIG. 4, along the section line A-A in FIG. 4.
Figure 4:
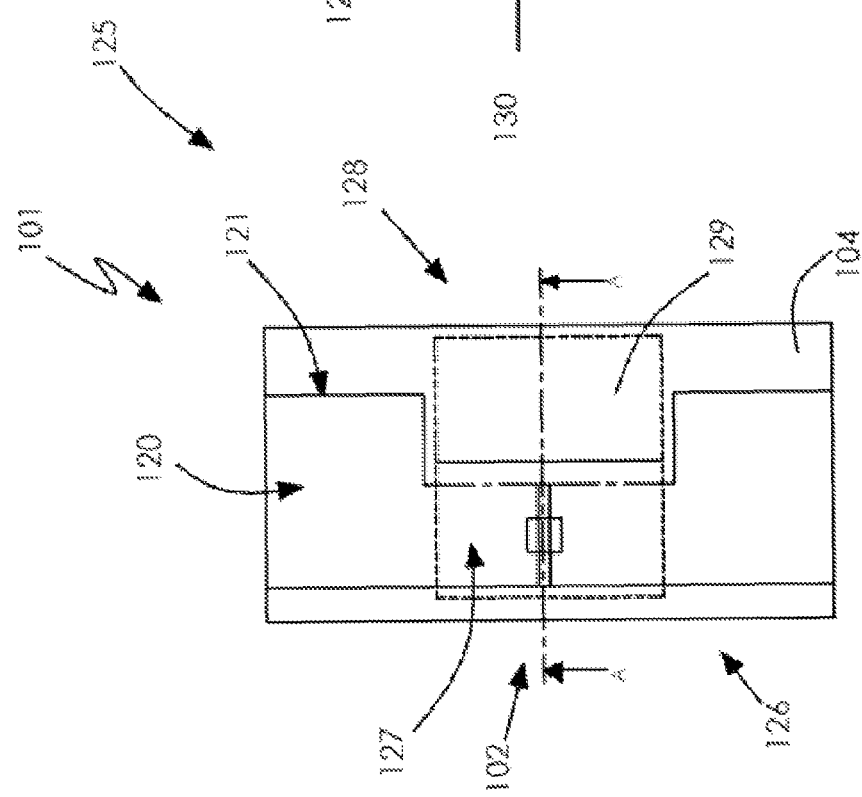
FIG. 4 shows schematically a plan view of an interposer with a flipped RFID chip.

The semiconductor component 101 shown in FIGS. 4 and 5 is an interposer 125 with an RFID chip 102. The semiconductor component 101 has a flexible film substrate 104, which is partly coated with a structured copper metallisation 120. The structured copper metallisation 120 is also a reference edge 121 on the flexible film substrate 104. All further location-relevant operations are with reference to the reference edge 121, so that they can be carried out for the film substrate 104 specially precisely and at very high speed.

On the flexible film substrate 104, there is a foldable folding area 126, which is punched out of the flexible film substrate 104 as a clip 127. Between the clip 127 and the structured copper metallisation 120, the RFID chip 102 is arranged, the RFID chip 102 being connected electrically to the structured copper metallisation 120 by electrical connections (not shown in more detail here), as soon as the foldable folding area 126 from FIG. 5 has been folded. Before the folding, the RFID chip 102 was bonded to the foldable folding area 126 by means of an adhesive deposit 115, so that the RFID chip 102, together with the clip 127, could be folded.

The clip 127, which is worked out of the flexible film substrate 104 in this way and folded onto the flexible film substrate 104, leaves a material recess 128 in the shape of a window area 129 in the flexible film substrate 104. In the case of the semiconductor component 101, with only one flexible film substrate 104, encapsulation of the RFID chip 102 is possible, so that the RFID chip 102 is specially well protected from damaging environmental effects. To be able to seal a gap 130 in the area between the folded clip 127 and the flexible film substrate 104 better, more adhesive 131 is arranged there.

Figure 6:
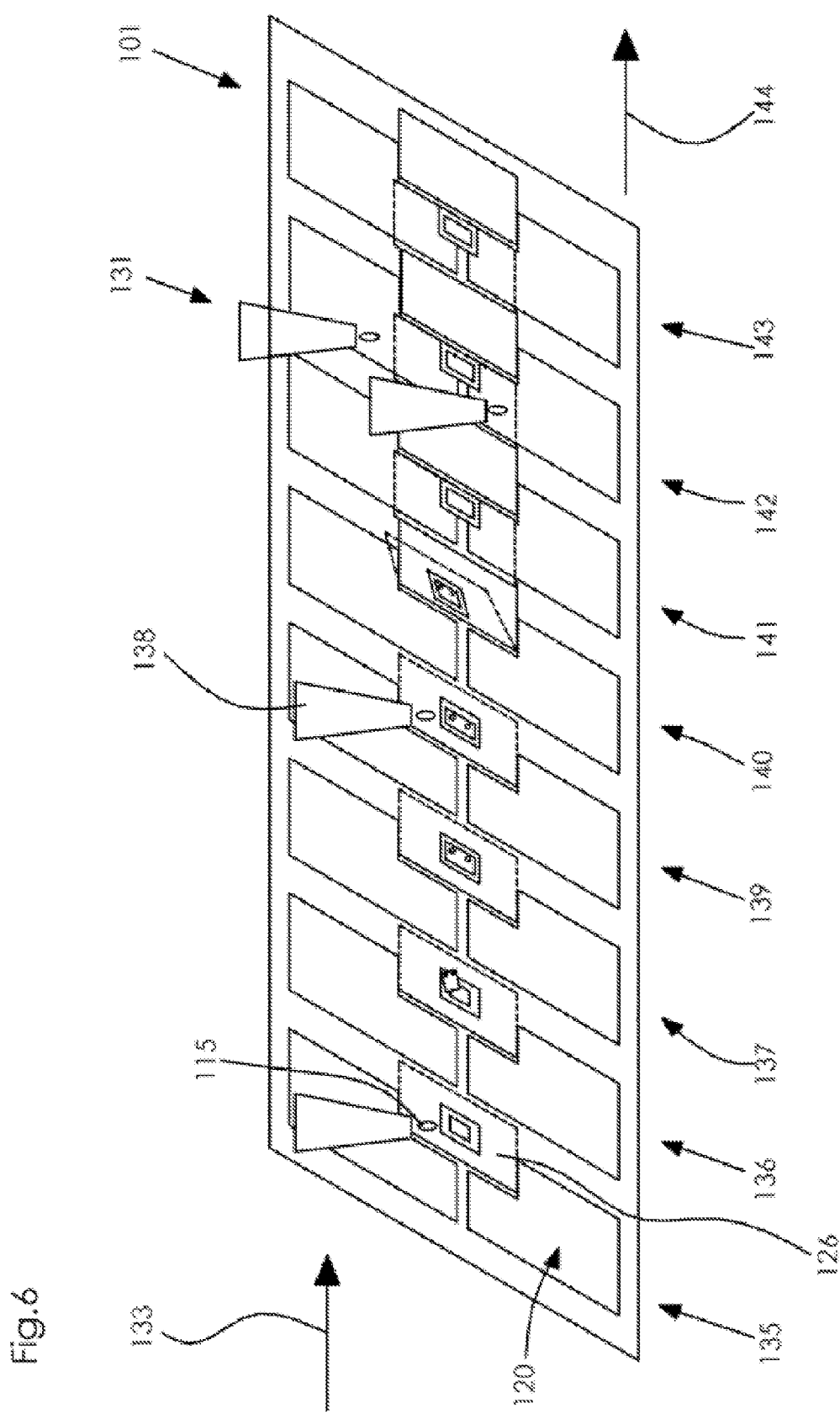
FIG. 6 shows schematically a method flow to produce the interposer from FIGS. 4 and 5.

In FIG. 6, a continuous process for producing the interposer 125 from FIGS. 4 and 5 is shown, a film sheet, which already carries prestructured film substrates 104 with the structured copper metallisation 120, being fed in on the input side 133. In a method step 135, shown first here, the adhesive deposit 115 is sprayed (jetted) onto the foldable folding area 126. In a subsequent method step 136, the RFID chip 102 is placed, without contact, on the adhesive deposit 115, where it aligns itself. The adhesive deposit 115 now cures, and the RFID chip 102, in a further method step 137, is correctly aligned, oriented and fixed on the flexible film substrate 104. Now a flux 138 can be sprayed (jetted) onto the RFID chip 102 or onto the contacting position of the carrier opposite the chip, see method step 139.

Next, the foldable folding area 126 is folded onto the flexible film substrate 104 or onto the structured copper metallisation 120 as a clip 127, together with the RFID chip 102 (see method step 140), then to solder the RFID chip 102 to the structured copper metallisation 120, with the aid of the flux 138, in an additional method step 141. To seal the gap 130 (see FIG. 5) additionally, in a further method step 142 more adhesive 131 is deposited on the flexible film substrate 104, it cures (see method step 143), and the individual semiconductor components 101 which have been produced until now can be provided for further processing on the output side 144.

In a variation of the flow illustrated in FIG. 6, instead of the flux, a combination of adhesive and flux, or only adhesive 131, is deposited on the contacting position or chip 102. The quantity is dimensioned so that the adhesive and the flux, or only the adhesive 131, fill the gap 130 to the extent that subsequent filling with adhesive 131, as described above, is no longer necessary.

The further semiconductor component 201 shown in FIGS. 7 and 8 is an interposer 225 with a flexible film substrate 204, on which a LED chip 202 has been deposited without contact. The flexible film substrate 204 is at least partly coated with structured copper metallisations 220 and 220A. In particular, the structured copper metallisation 220A also provides, on the film substrate 204, a reference edge 221, starting from which all further essential operations are co-ordinated.

On the flexible film substrate 204, here too a foldable folding area 226, which is punched out of the film substrate 204 as a clip 227, is provided. The LED chip 202 is placed between a first structured copper metallisation 220 and the clip 227 or a further structured copper metallisation 220A, the LED chip 202 being connected electrically by electrical connections (not shown in more detail here), to both the first structured copper metallisation 220 and the further structured copper metallisation 220A, as soon as the foldable folding area 226 from FIG. 8 has been folded.

Before the folding, the LED chip 202 was fixed to the foldable folding area 226 by means of an solder paste deposit 215 which was printed onto the folding area 226, so that the LED chip 202, together with the clip 227, could be folded.

The clip 227, which is worked out of the flexible film substrate 204 in this way and folded onto the flexible film substrate 204, leaves a material recess 228 in the shape of a window area 229 in the flexible film substrate 204.

In the case of the semiconductor component 201, with only one flexible film substrate 204, encapsulation of the LED chip 202 is possible, so that the LED chip 202, in this case too, is specially well protected from damaging environmental effects. To be able to seal a gap 230 in the area between the folded clip 227 and the film substrate 204 better, adhesive 231 is fed into the gap 230 by application before or after folding.

Figure 9:
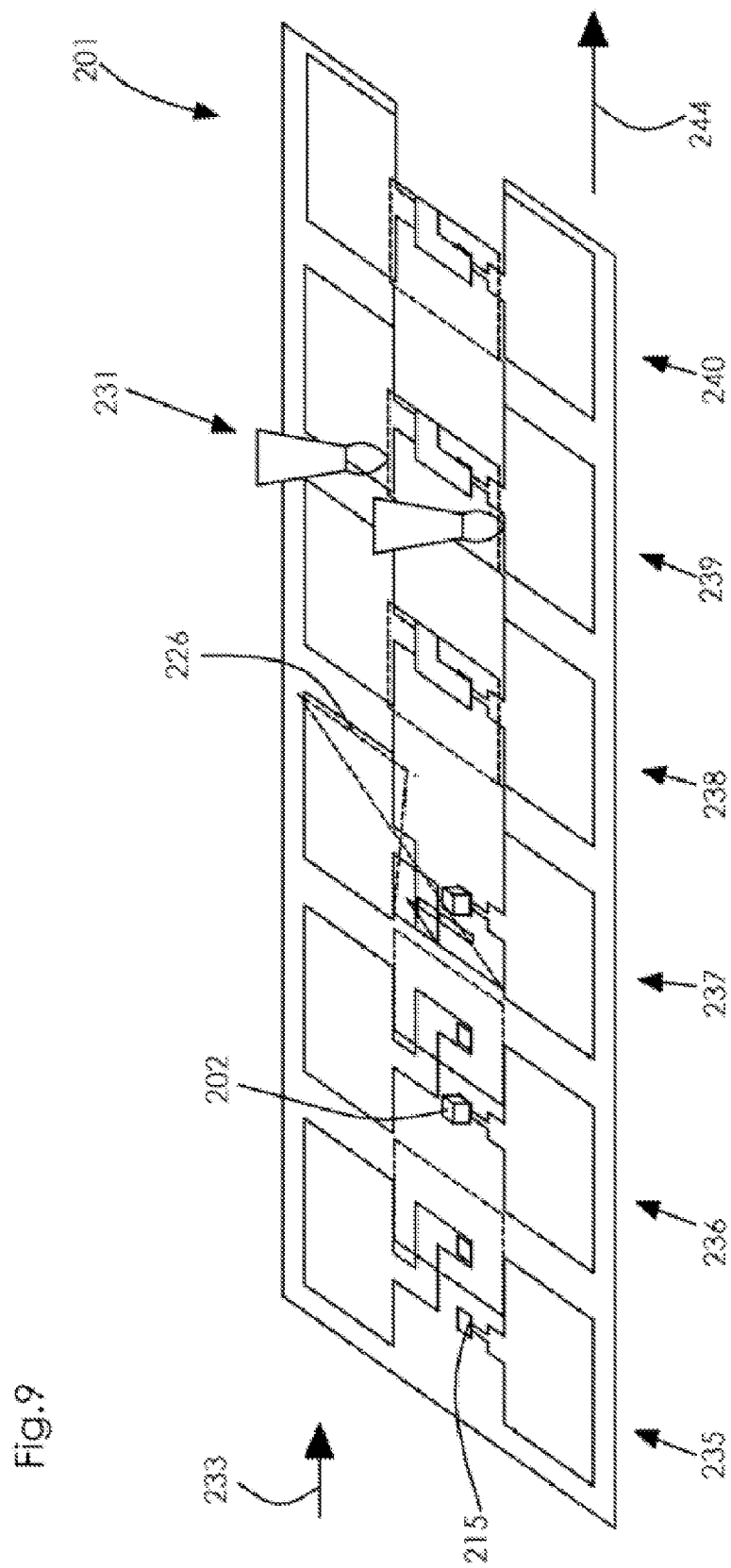
FIG. 9 shows schematically a method flow to produce the further interposer from FIGS. 7 and 8.
Figure 10:
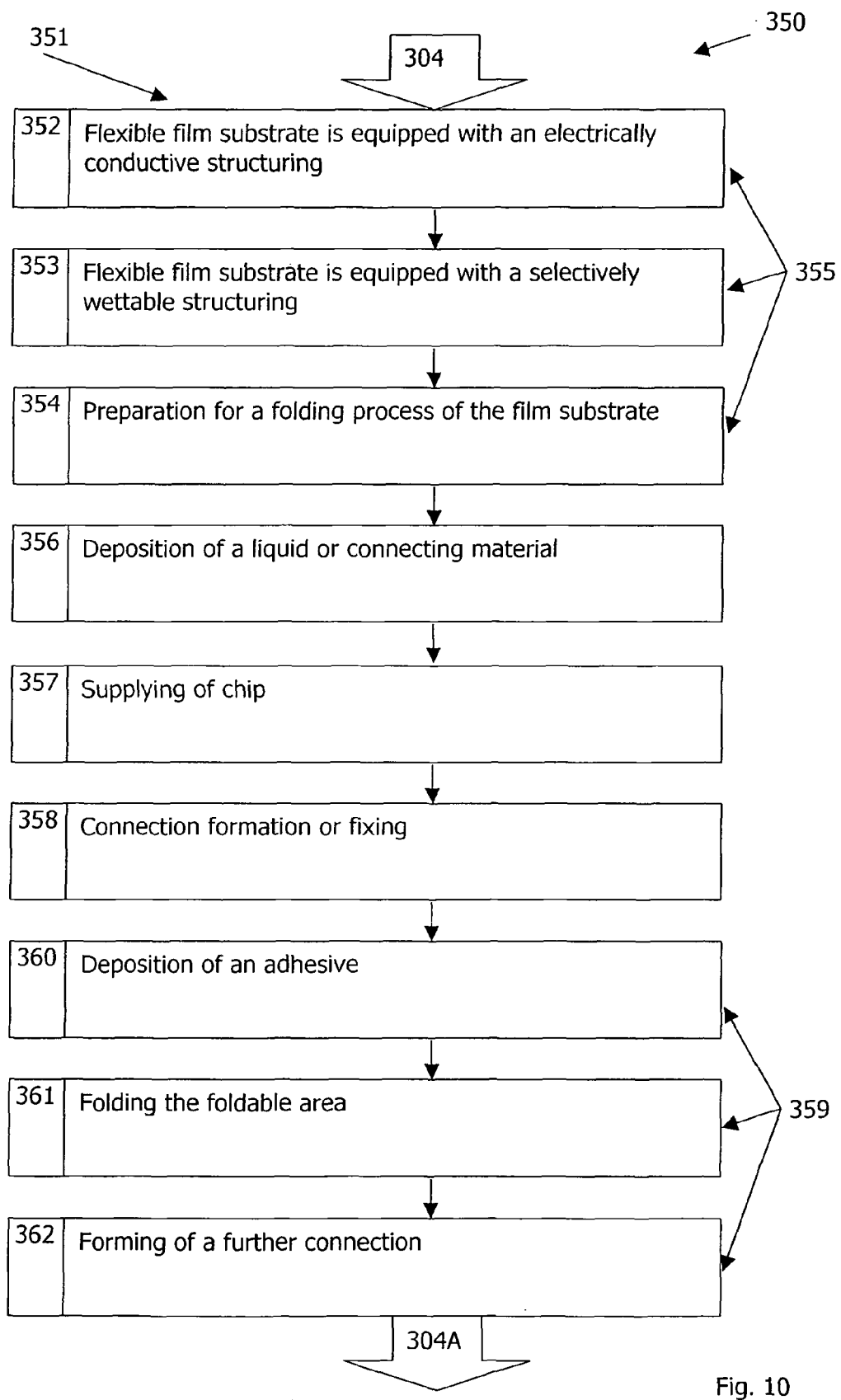
FIG. 10 shows schematically a flowchart of a roller-to-roller method for contacting a chip by folding from a continuous film substrate.

In FIG. 9, a further continuous process for producing the interposer 225 from FIGS. 7 and 8 is shown, a film sheet, which already has prestructured film substrates 204 with the copper metallisations 220, 220A, being fed in on the input side 233. In the method step 235, shown first here, the solder paste deposit 215 is printed onto the flexible film substrate 204. In a subsequent method step 236, the LED chip 202 is placed, without contact, on the solder paste deposit 215, so that the LED chip 202 is at least pre-fixed on the flexible film substrate 204. Next, heat is supplied locally, e.g. by heating the film substrate 204 from below by means of a heating device (not otherwise illustrated here), so that the solder melts and the chip floats into the intended position which the structure specifies. Now the foldable folding area 226 can be folded onto the LED chip 202, as can be seen on the basis of the further method step 237. The LED chip 202 is then soldered to the structured copper metallisations 220 and 220A in an additional method step 238. To seal the gap 230 (see FIG. 8) additionally, in a next method step 239 adhesive 231 is deposited on the flexible film substrate 204, and it then cures (see further method step 240). Next, the semiconductor components 201 which have been produced until now are ready for further processing (see output side 244).

In the process chain 351 of a roller-to roller method, shown in the flowchart 350, a flexible film substrate 304 is equipped, on the one hand, with an electrically conductive structuring 352, and on the other hand with a selectively wettable structuring 353; the electrically conductive structuring 352 and the selectively wettable structuring 353 can be identical. In particular, the electrically conductive structuring 352 here can be an aerial, an interposer, a strap or similar.

Additionally, preparation 354 for a folding process of the film substrate 304 takes place, by another foldable folding area being perforated on the flexible film substrate 304. Consequently prestructuring 355 of the film substrate 304 is essentially restricted. Additionally, using the structuring 352, a reference or reference area, from which the exact positions, e.g. the position of the perforation and/or the position of the chips, can be measured and determined by means of a camera, can be created.

Now, with one application 356, a liquid or connecting material (e.g. adhesive) is deposited on the flexible film substrate 304, following which a chip is supplied 357, and aligns itself on the connecting material on the substrate 304. Connection formation or fixing 358 also takes place between the chip and the film substrate 304. The chip is contacted electrically 359 by folding the film substrate 304. For this purpose, first an adhesive is deposited 360. Next the foldable folding area is folded 361, so that a further connection 362 is formed. Before folding, more adhesive can be deposited. With the explained process chain 351, a film substrate 304A, fully populated with at least one chip, can be provided for further processing.

The process chain 351 can also be used to produce the semiconductor component 1, 101 and 201, described above as an example.

Figure 11:
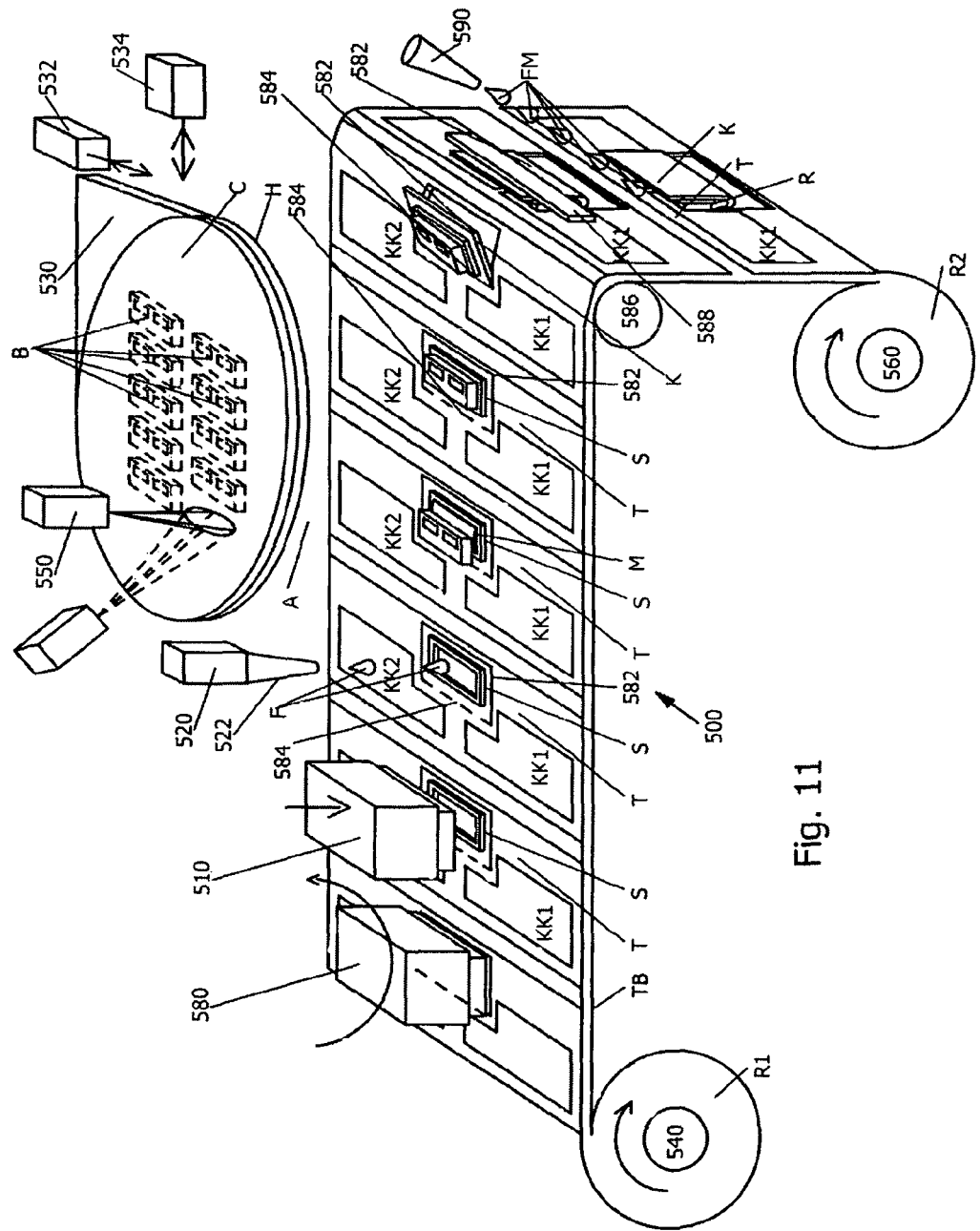
FIG. 11 shows schematically a device for carrying out a roller-to-roller method for contacting a chip by folding from a continuous film substrate.

FIG. 11 illustrates schematically a device 500, which can be used to carry out a continuously executable roller-to-roller method for producing an electronic module with at least one electronic component B and one carrier T. In the illustrated example, the carrier T is an interposer which comes from a roller with a flexible PET film, and which already carries two printed-on copper contact areas KK1, KK2 with a free area between them.

A facility 510 in the form of a printing unit is used to provide a structure S in the region of the free area on the surface of the carrier T by applying material, in this example in the form of a ring which is rectangular in plan view. The facility 510 can also be in a printing system which is placed upstream from the device shown in FIG. 11. The shape and dimensions of the structure S are such that an electronic component B can align itself on it, to take a desired target position. In this example, the component B is a semiconductor chip with two connecting contacts K1, K2, which in the fully assembled state are connected electrically and mechanically to the two copper contact areas KK1, KK2.

Figure 12:
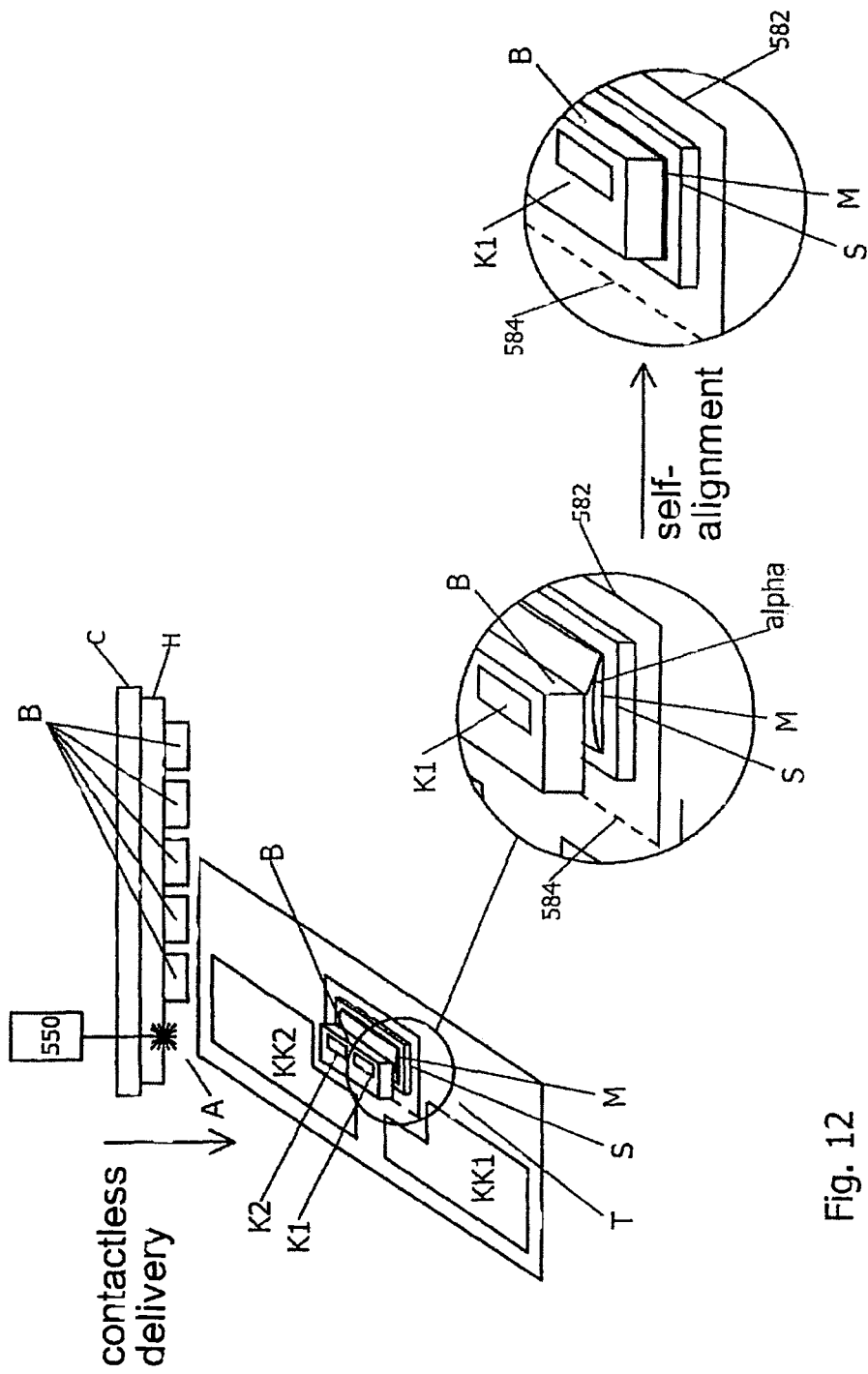
FIG. 12 shows schematically a stock of chips for contactless delivery to the structure on which the chip aligns itself.

In a downstream processing station, a facility 520 for coating the structure S with a material F to form a liquid meniscus M is provided. The facility 520 here has a controllable nozzle for apportioned delivery of the material F. In this example, the material F is an adhesive. The liquid meniscus M which forms in the structure S is convex, the curvature of the liquid meniscus M in side view enclosing an acute angle (alpha—see also FIG. 12) with edges of the structure S.

In a downstream processing station, a receptacle 530 for a stock of multiple electronic components B is provided at a delivery point A. A first conveying device 540 in the form of a rotary actuator is used to unwind the roll R1 with the unprocessed carriers T. A second conveying device 560 in the form of a rotary actuator rewinds a roll R2 with completely processed carriers and deposited components. These conveying devices are used to move the carrier T, with the structure S, to nearby opposite the delivery point A. Near the delivery point A, there is a laser light source as an energy feed facility 550, to initiate contactless delivery of one of the components B from the delivery point A, while the structure S on the carrier T is near or moving past the delivery point A, so that the component B, after a free phase, at least partly touches the liquid meniscus M. To avoid overheating/damaging/destroying the component B by the radiation of the laser light source 550, its laser beam is defocused by a lens (not otherwise illustrated here) or other measures, so that the radiation which strikes the component B corresponds approximately to the area of the component B.

In the shown variant, the distance—which defines the free phase of the component B—between the receptacle 530 for the stock of components B and the structure S is, for instance, in the order of magnitude of less than one to one edge length of the components B. If turning the chip can be prevented by suitable measures in the free phase, or if connecting contacts are formed on two opposite surfaces of the chip and the chip does not have to be connected with correct polarity, the gap can also be a multiple of the chip edge length.

In the shown variant, the first and second conveying devices 540, 560 continuously convey a carrier tape TB with multiple carriers T, each having the structure S. A dispensing facility 520 is used to load an apportioning facility 522 for the (adhesive) material F. In this way, the latter can be delivered to the structure S in such a quantity that in every structure S which passes the apportioning facility 522, the liquid meniscus M forms convexly relative to the structure S.

The receptacle 530 has an adjustment facility 532, 534 which can be positioned in two dimensions, in the form of linear drives using which the receptacle 530 can be moved relative to the delivery point A. Because of the self-alignment of the chip on the structure (after it is delivered to the structure), special precision of the linear drives is not required. It is sufficient if the carrier layer C, with the semiconductor chips adhering to it, is set up to position in these two dimensions, so that one of the semiconductor chips at the delivery point A is near a structure S, which is opposite to it at a distance.

To deliver one of the components B from the stock with the multiple electronic components B at a delivery point A so that it aligns itself on the material F on the structure S, an energy feed facility 550 supplies heat energy from a side of the carrier layer C facing away from the adhering semiconductor chips (in FIG. 12 from above, whereas the chips adhere to the carrier layer from below), through the carrier layer C onto an individual semiconductor chip B, in such a way that the relevant semiconductor chip B separates from the adhesive layer H on the carrier layer C, and then contacts the liquid meniscus M at least with part of one of its side surfaces (usually its base).

Additionally, in this example, the device 500 has a punching facility 580, to form a rectangular perforation 582 which surrounds the structure S, with a hinge edge 584 from the carrier T facing the two copper contact areas KK1, KK2. In this way a flap K surrounding the structure S is removed from the carrier T. The carrier sheet TB is deflected downward by 90° at the deflection roller 586. In this case the flap K will project from the surface of the carrier sheet TB. The punching facility 580 can also be upstream from the device 500.

In a subsequent processing station, just above the carrier sheet TB, a folding sheet 588 is installed, as a facility for folding the flap K completely. In this way the connecting contacts K1, K2 of the semiconductor chip and the copper contacts KK1, KK2 of the carrier T contact each other.

As a further processing station, the device 500 has a filling facility 590 for filler FM, to fill a space R, which contains the semiconductor chip, between the carrier T and the flap K, with the filler FM, so that the semiconductor chip is at least partly embedded in the filler FM. The filling facility 590 can also be upstream from the facility for folding the flap K completely. Before the winding, in a final station (not shown pictorially here) for curing the filler, the filler is cured according to the curing mechanism, e.g. by stopping the clip or supplying heat or light, e.g. UV light. Finally, the electronic modules which are completed in this way are wound onto the roller R2.

The details explained above of the methods, the device and the products are presented in combination; however, it should be pointed out that they, at least to the extent that individual claims directed at them are listed, are also independent of each other, and can also be freely combined with each other. Thus, for instance, delivering a semiconductor chip to the structure with, for instance, two or more connecting contacts facing the structure is also disclosed, the structure being formed of multiple partial structures—one partial structure for each connecting contact—each of which contains a solder deposit with flux. After the semiconductor chip has landed on the structure with the material, the solder is melted and the chip automatically aligns itself to the structure or partial structures on the melted solder. If the chip has further connecting contacts on its opposite side surface, it can now be turned over, to contact these connections too.

The ratios of the individual parts and sections of them to each other as shown in the figures, and their dimensions and proportions, must not be understood as restrictive. Instead, individual dimensions and proportions can differ from those shown.

The invention claimed is:

1. A method for producing an electronic module with at least one electronic component and one carrier, said method comprising:
    (a) providing a structure on the carrier, the structure being suitable for aligning the electronic component, so that the electronic component can take a desired target position relative to the structure,
    (b) coating the structure with a material which is an adhesive, which at least partly remains between the structure and the component, or is a solder, which includes flux and is melted to form a liquid meniscus, the liquid meniscus being suitable for receiving the electronic component at least partially,
    (c) providing a stock of multiple electronic components at a delivery point for the electronic components,
    (d) moving the carrier, with the structure, at least nearby and opposite to the delivery point,
    (e) delivering, without contact, at the delivery point one of the electronic components, while the structure on the carrier is near the delivery point, so that after a phase of free movement the electronic component at least partly touches the material,
    (f) moving the carrier, with the structure, to a downstream processing point, while the electronic component aligns itself to the structure on the liquid meniscus of the material, to take its target position, and
    (g) connecting and fixing the electronic component and the carrier via the structure on the carrier by the material.

2. The method according to claim 1, wherein a carrier tape is moved continuously with multiple carriers, which each have the structure, to nearby and opposite to the delivery point for the electronic components, and away from there, or a carrier tape is moved in steps with the multiple carriers, which each have the structure, to nearby and opposite to the delivery point for the electronic components, and away from there.

3. The method according to claim 1,
    (a) wherein the structure is formed on the carrier by applying material to a surface of the carrier, or by removing material from a surface of the carrier, and
    (b) wherein the structure comprises a shape, which shape is adapted to a contour of the electronic component, or
    (c) wherein the structure fixes the target position of the electronic component in one or more dimensions or the orientation of the electronic component in one or more directions.

4. The method according to claim 1, wherein the structure is provided, on the carrier, having multiple substructures, each of which delimits an area, to form the liquid meniscus.

5. The method according to claim 1, wherein the material
    (a) is of such a form that the liquid meniscus is formed convexly relative to the structure, or
    (b) is delivered to the structure in such a quantity that the liquid meniscus is formed convexly relative to the structure, or
    (c) in subsequent processing, has to be removed at least partly from the structure.

6. The method according to claim 1, wherein the material is a solder, which includes flux and is melted on, wherein before the carrier with the structure reaches a downstream processing point, the solder, which includes flux, is melted as the liquid meniscus is formed, so that the electronic component which is in contact with the liquid meniscus aligns itself on the structure and takes a target position.

7. The method according to claim 1, wherein the electronic component is a semiconductor chip with metallic connecting contacts, which are arranged on one side surface, or two opposite side surfaces, of the semiconductor chip, the electronic component being delivered from the delivery point in such a way that either;

(a) a side surface with the metallic connecting contacts faces the material, and a side surface without the connecting contacts faces away from the material, or (b) a side surface with the metallic connecting contacts faces the material, and a side surface with the metallic connecting contacts faces away from the material, or (c) at least one side surface with the metallic connecting contacts is oriented transversely to the surface of the material.

8. The method according to claim 1, wherein for the delivery step (e) of claim 1, multiple electronic components are fed to the delivery point adhering to a carrier layer as isolated semiconductor chips, in which case the isolated semiconductor chips adhere to a side of the carrier layer facing the carrier.

9. The method according to claim 8, wherein for the delivery step (e) of claim 1, an energy is directed onto an individual semiconductor chip, from a side of the carrier layer facing away from the adhering semiconductor chips, through the carrier layer, in such a way that the semiconductor chip separates itself from the carrier layer, and then contacts the material and/or the liquid meniscus at least with part of one of its side surfaces.

10. The method according to claim 9, wherein for the delivery step (e) of claim 1, the energy is partly or completely converted into heat in the semiconductor chip which is to be separated from the carrier layer, in the semiconductor chip, in the carrier layer, and in the adhesive layer, so that an adhesive layer, which is between the semiconductor chip and the carrier layer, and which reacts to heat, releases the semiconductor chip from the adhesive layer.

11. The method according to claim 10, wherein for the delivery step (e) of claim 1, the carrier layer is provided with the adhesive layer for the isolated semiconductor chips, and wherein the adhesive layer at least partly disintegrates because of at least part of the energy being directed onto the semiconductor chip, to exert a mechanical impulse onto the semiconductor chip, moving the semiconductor chip away from the carrier layer.

12. The method according to claim 7, wherein (a) the carrier is formed from an elastically or plastically ductile material, (b) the carrier is provided with an electrically conducting pattern, which has at least one path, which path either;

i. is formed so that the path reaches so far into the structure that it contacts one of the connecting contacts of a semiconductor chip after the semiconductor chip is aligned on the structure, or ii. is formed so that the path reaches into an area of the carrier at a distance from the structure, in which case the following steps (a) to (c) are carried out:

a. forming a perforation or weakened point in the area of the carrier around part of the path of the pattern, to form a flap which contains part of the path, b. removing the flap from the carrier, and c. folding the flap so that the part of the path on the flap contacts at least part of one of the connecting contacts of the semiconductor chip, or the following steps (d) to (f) are carried out:

d. forming a perforation or weakened point in the area of the carrier, to form the flap which contains the semiconductor chip, e. removing the flap from the carrier, and f. folding the flap so that on the flap, the semiconductor chip contacts at least part of the path of the pattern with at least one of the connecting contacts.

13. The method according to claim 12, wherein a space which contains the semiconductor chip, between the carrier and the flap, is filled with a filler, so that the semiconductor chip is at least partly embedded in the filler.

14. A device for producing an electronic module with at least one electronic component and one carrier, said device comprising;

a structure provided on the carrier, where the structure is suitable for aligning the electronic component, so that the electronic component can take a desired target position relative to the structure, or a carrier feeding facility for feeding the carrier provided with the structure, in which case the structure is suitable for aligning an electronic component, so that the electronic component can take a desired target position relative to the structure, a structure loading facility for loading the structure with a material which is an adhesive or a solder for forming a liquid meniscus, the liquid meniscus being suitable for receiving the electronic component at least partially, a receptacle for a stock of multiple electronic components at a delivery point for the electronic components, a first conveying facility, for moving the carrier, with the structure, at least to nearby opposite the delivery point, an energy feed facility to initiate contactless delivery of one of the electronic components from the delivery point, while the structure on the carrier is moving near the delivery point, so that after a phase of free movement the electronic component at least partly touches the liquid meniscus, and a second conveying facility, for moving the carrier, with the structure, to a downstream processing point, while the electronic component aligns itself to the structure on the liquid meniscus, and takes a target position.

15. The device according to claim 14, wherein the first and second conveying facilities convey a carrier tape, with multiple carriers each having the structure, continuously or in steps, or the first and second conveying facilities are either a unitary conveying facility or separate conveying facilities.

16. The device according to claim 14, wherein the structure provided on the carrier is set up to form the structure either by applying material to one surface of the carrier or by removing material from one surface of the carrier.

17. The device according to claim 14, with a facility for loading an apportioning facility, to deliver the material in such a form or such a quantity to the structure that the liquid meniscus is formed convexly relative to the structure.

18. The device according to claim 14, wherein either (a) if the material is a solder which includes flux, a heating facility to melt the solder is provided, and before or when the carrier with the structure moves to a downstream processing point, it melts the solder, forming the liquid meniscus, so that the electronic component in contact with the liquid meniscus aligns itself on the structure and takes a target position, or (b) in subsequent processing, if the material is to be at least partly removed from the structure, a heating facility is provided, to expel the material at least partly from the structure.

19. The device according to claim 14, wherein the receptacle has an adjustment facility which can be positioned in at least two dimensions, or is set up to position a carrier layer, with semiconductor chips, in the two dimensions, in such a way that in each case one of the semiconductor chips is near an opposite structure at a distance.

20. The device according to claim 19, wherein the energy feed facility is a heat energy source which is set up to radiate the heat energy to a side of the carrier layer facing away from the semiconductor chips through the carrier layer to an individual semiconductor chip, in such a way that the semiconductor chip separates from the carrier layer, and afterwards contacts the liquid meniscus with at least part of one of its side surfaces.

21. The device according to claim 19, wherein the adjustment facility is set up to position the carrier layer in at least two dimensions in such a way that an adhesive layer on the carrier layer is able to hold an isolated semiconductor chip.

22. The device according to claim 14, with
 (a) a facility for forming a perforation or weakened point of the carrier, which is formed of an elastically or plastically ductile material, to make a perforation or weakened point in an area of the carrier, to form a flap,
 (b) a facility for removing the flap from the carrier, and
 (c) a facility to fold the flap so that under the flap, at least one of connecting contacts of a semiconductor chip, and the carrier contact each other.

23. The device according to claim 22, with a filling device for a filler, to fill a space between the carrier and the flap, containing the semiconductor chip, with the filler, in such a way that the semiconductor chip is at least partly embedded in the filler.

24. The device according to claim 23, with a facility for hardening the filler.

25. An electronic module, with at least one electronic component and one carrier, with;
 (a) on the carrier, a structure on which the electronic component is aligned in the target position of the electronic component, and
 (b) between the carrier and the electronic component, a material on which the electronic component is received, wherein the electronic component is a semiconductor chip with metallic connecting contacts, and
  the carrier is formed from an elastically or plastically ductile material, and
  the carrier has an electrically conducting pattern with at least one path which reaches into an area of the carrier at a distance from the structure, and wherein
  a flap is provided on the carrier, wherein the flap is formed and folded so that a part of the path on the flap contacts at least a part of the connecting contacts of the semiconductor chip, or
  the flap is formed and folded so that the semiconductor chip on the flap contacts at least part of the path of the pattern with at a least one of the connecting contacts.

26. The electronic module according to claim 25,
 (a) wherein the structure is formed on the carrier, by a material applied to one surface of the carrier or by a material removed from one surface of the carrier, and
 (b) wherein the structure comprises a shape, which shape is adapted to a contour of the electronic component, or
 (c) wherein the structure fixes the target position of the electronic component regarding the position of the electronic component in one or more dimensions or the orientation of the electronic component in one or more directions.

27. The electronic module according to claim 25, wherein the structure has multiple partial structures, each of which delimits an area and receives the material, on the carrier.

28. The electronic module according to claim 25, wherein the material
 (a) is an adhesive, which at least partly remains between the structure and the component, or
 (b) is solder.

29. The electronic module according to claim 25, wherein the metallic connecting contacts of the semiconductor chip, are arranged on one side surface, or two opposite side surfaces, of the semiconductor chip, in which case either;
 (a) a side surface of the component with the metallic connecting contacts faces the material, and a side surface without the connecting contacts faces away from the material, or
 (b) a side surface of the component with the metallic connecting contacts faces the material, and a side surface with the metallic connecting contacts faces away from the material, or
 (c) a side surface of the component with the metallic contacts faces away from the material, and a side surface without the metallic contacts faces the material, or
 (d) at least one side surface of the component with the metallic connecting contacts is oriented transversely to the surface of the material.

30. The electronic module according to claim 25, wherein a space between the carrier and the flap, containing the semiconductor chip, is filled with a filler, in such a way that the semiconductor chip is at least partly embedded in the filler.

* * * * *